(12) United States Patent
Dorfman

(10) Patent No.: US 7,857,998 B2
(45) Date of Patent: Dec. 28, 2010

(54) HIGH CONDUCTIVITY POLYMER THICK FILM SILVER CONDUCTOR COMPOSITION FOR USE IN RFID AND OTHER APPLICATIONS

(75) Inventor: Jay Robert Dorfman, Durham, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 163 days.

(21) Appl. No.: 12/276,662

(22) Filed: Nov. 24, 2008

(65) Prior Publication Data

US 2010/0127223 A1    May 27, 2010

(51) Int. Cl.
*H01B 1/22* (2006.01)
(52) U.S. Cl. .................. 252/514; 427/125; 340/572.1; 340/10.1; 361/751; 106/1.19
(58) Field of Classification Search ............... 252/514; 427/125; 340/572.1, 10.1; 361/751; 106/1.19
See application file for complete search history.

(56) References Cited

U.S. PATENT DOCUMENTS

| | | | |
|---|---|---|---|
| 5,141,777 A | | 8/1992 | Frentzel et al. |
| 5,756,008 A | * | 5/1998 | Slutsky et al. ............... 252/514 |
| 5,855,820 A | * | 1/1999 | Chan et al. .................. 252/511 |
| 6,939,484 B2 | * | 9/2005 | Dorfman .................... 252/514 |
| 2003/0108664 A1 | * | 6/2003 | Kodas et al. ................ 427/125 |
| 2003/0148024 A1 | * | 8/2003 | Kodas et al. ................ 427/125 |
| 2006/0043346 A1 | * | 3/2006 | Kodas et al. ................ 252/514 |
| 2006/0189113 A1 | * | 8/2006 | Vanheusden et al. ........ 438/597 |
| 2008/0010809 A1 | | 1/2008 | Lin et al. |
| 2009/0288517 A1 | * | 11/2009 | Chretien et al. ............... 75/371 |

FOREIGN PATENT DOCUMENTS

| | | |
|---|---|---|
| EP | 1538180 A | 6/2005 |
| WO | 84/02423 A | 6/1984 |
| WO | WO 2008018718 A1 * | 2/2008 |

OTHER PUBLICATIONS

International Search Report for International Application No. PCT/US2009/065494 Dated Feb. 23, 2010.

* cited by examiner

*Primary Examiner*—Douglas Mc Ginty

(57) ABSTRACT

Disclosed are thick film silver compositions comprised of silver flake and organic medium useful in radio frequency identification devices (RFID). The invention is further directed to method(s) of antenna formation using RFID circuits or other circuits using polymer thick film (PTF).

12 Claims, No Drawings

HIGH CONDUCTIVITY POLYMER THICK FILM SILVER CONDUCTOR COMPOSITION FOR USE IN RFID AND OTHER APPLICATIONS

FIELD OF THE INVENTION

The invention is directed to a polymer thick film (PTF) silver conductor composition for use in Radio Frequency Identification Devices (RFID) and other applications. In one embodiment, the PTF silver composition is used as a screen-printed conductor on a flexible low temperature substrate, such as polyester, where the PTF silver composition functions as an antenna. This composition may further be used for any other application where extremely high conductivity and low resistivity is required.

BACKGROUND OF THE INVENTION

Polymer thick film silver compositions are used in RFID devices as well as other applications such as Membrane Touch Switches, Appliance Circuitry, or any uses where a high conductivity polymer thick film silver conductor is required. Such products are typically used as the printed antenna of the cell. An antenna pattern of the polymer thick film silver composition is printed on top of the appropriate substrate. RFID circuit performance is dependent on both the conductivity of the printed antenna and the resistance of the circuit. The lower the resistivity (inverse of conductivity) the better the performance of any polymer thick film composition used is such circuitry. It is desirable to use a composition that has low restivity and is suitable for coating at thicknesses necessary for RFID applications.

SUMMARY OF THE INVENTION

The present invention is directed to a polymer thick film composition comprising: (a) silver flake (b) organic medium comprising (1) organic polymeric binder; (2) solvent; and (3) printing aids that have low restivity. The composition may be processed at a time and temperature necessary to remove all solvent. Specifically, the composition comprises (a) 50-85% by weight silver flake with an average particle size of at least 3 microns, at least 10% of the particles greater than 7 microns, and stearic acid surfactant (b) 15-50% by weight organic medium comprising
  (1) 16-25% by weight vinyl copolymer resin
  (2) 75-84% by weight organic solvent.

The composition may also contain up to 1% by weight of gold, silver, copper, nickel, aluminum, platinum, palladium, molybdenum, tungsten, tantalum, tin, indium, lanthanum, gadolinium, boron, ruthenium, cobalt, titanium, yttrium, europium, gallium, sulfur, zinc, silicon, magnesium, barium, cerium, strontium, lead, antimony, conductive carbon, and combinations thereof.

The invention is further directed to method(s) of electrode formation on RFID or other circuits using such composition and to articles formed from such methods and/or composition.

DETAILED DESCRIPTION OF INVENTION

Generally, a thick film composition comprises a functional phase that imparts appropriate electrically functional properties to the composition. The functional phase comprises electrically functional powders dispersed in an organic medium that acts as a carrier for the functional phase. In general, a thick film composition is fired to burn out the organics and to impart the electrically functional properties. However, in the case of a polymer thick film composition, the organics remain as an integral part of the composition after drying. Such "organics" comprise polymer, resin or binder components of a thick film composition. These terms may be used interchangeably.

The main components of the thick film conductor composition are a conductor powder dispersed in an organic medium, which is comprised of polymer resin and solvent. The components are discussed herein below.

A. Conductor Powder

The electrically functional powders in the present thick film composition are Ag conductor powders and may comprise Ag metal powder, alloys of Ag metal powder, or mixtures thereof. The particle diameter, shape, and surfactant used on the metal powder are particularly important and have to be appropriate to the application method.

The particle size distribution of the metal particles is itself critical with respect to the effectiveness of the invention. As a practical matter, it is preferred that the particles size be in the range of 1 to 100 microns. The minimum particle size is within the range of 1-10 microns, such as 1, 2, 3, 4, 5, 6, 7, 8, 9, or 10 microns. The maximum size of the particles is within the range of 18-100 microns, such as 18, 20, 25, 30, 35, 40, 45, 50, 55, 60, 65, 70, 75, 80, 85, 90, 95 or 100 microns. In one advantageous embodiment the silver flake ranges from 2-18 microns.

The metal particles are present at from 50-85% by weight of the total composition.

It is also important that a surfactant be used in the composition to facilitate the effective alignment of the flaked silver particles herein. Stearic acid is the preferred surfactant for the flaked silver.

Furthermore, it is well known in the art that small amounts of other metals may be added to silver conductor compositions to improve the properties of the conductor. Some examples of such metals include: gold, silver, copper, nickel, aluminum, platinum, palladium, molybdenum, tungsten, tantalum, tin, indium, lanthanum, gadolinium, boron, ruthenium, cobalt, titanium, yttrium, europium, gallium, sulfur, zinc, silicon, magnesium, barium, cerium, strontium, lead, antimony, conductive carbon, and combinations thereof and others common in the art of thick film compositions. The additional metal(s) may comprise up to about 1.0 percent by weight of the total composition.

B. Organic Medium

The powders herein are typically mixed with an organic medium (vehicle) by mechanical mixing to form a paste-like composition, called "polymer thick film silver compositions" or "pastes" herein, having suitable consistency and rheology for printing. A wide variety of inert liquids can be used as an organic medium. The organic medium must be one in which the solids are dispersible with an adequate degree of stability. The rheological properties of the medium must be such that they lend good application properties to the composition. Such properties include: dispersion of solids with an adequate degree of stability, good application of composition, appropriate viscosity, thixotropy, appropriate wet ability of the substrate and the solids, a good drying rate, and dried film strength sufficient to withstand rough handling.

The polymer resin of the present invention is particularly important. The resin used in the present invention is a vinyl co-polymer which allows high weight loading of silver flake and thus helps achieve both good adhesion to polyester substrates and low resistivity (high conductivity), two critical properties for silver electrodes in RFID circuitry.

Vinyl-copolymer is herein defined as polymers produced by polymerizing the vinyl group of a vinyl monomer with at least one co monomer. Suitable vinyl monomers include but are not limited to vinyl acetate, vinyl alcohol, vinyl chloride, vinylidene chloride and styrene. Suitable co monomers include but are not limited to a second vinyl monomer, acrylates and nitriles. Vinylidene chloride copolymer with at least one of vinyl chloride, acrylonitrile, alkyl acrylate is a suitable polymer resin.

The most widely used organic solvents found in thick film compositions are ethyl acetate and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. In many embodiments of the present invention, solvents such as glycol ethers, ketones, esters and other solvents of like boiling points (in the range of 180° C. to 250° C.), and mixtures thereof may be used. In one advantageous embodiment the medium includes dibasic esters and C-11 ketone.

The medium comprises 16-25% by weight of the vinyl copolymer resin and 75-84% by weight organic solvent.

Application of Thick Films

The polymer thick film silver composition or paste herein is typically deposited on a substrate, such as a polyester, that is essentially impermeable to gases and moisture. The substrate can also be a sheet of flexible material, such as an impermeable plastic, such as a composite material made up of a combination of plastic sheet with optional metallic or dielectric layers deposited thereupon. In one embodiment, the substrate can be a build-up of layers including metalized silver.

The deposition of the polymer thick film silver composition is performed in one embodiment by screen printing, and in other embodiments by deposition techniques such as stencil printing, syringe dispensing or coating techniques. In the case of screen-printing, the screen mesh size controls the thickness of deposited thick film.

The deposited thick film is dried or the organic solvent is evaporated, such as by exposure to heat, for example 10-15 min at 120-140° C.

The present composition particly suitable for RFID related uses because of its:

(1) Unusually low resistivity observed (4.6 milliohm/sq/mil); and (2) The thickness of the print (9-10 microns using a 280 Stainless Steel screen) which is very important for RFID and other applications. The net result of (1) and (2) is very low circuit resistance, which is an extremely desirable and advantageous characteristic.

The present invention will be discussed in further detail by the below examples. The scope of the present invention, however, is not limited in any way by these examples.

EXAMPLE 1

The PTF silver electrode paste was prepared by mixing silver flake with an average particle size of 4 micron (range was 1-18 microns) that contains stearic acid as a surfactant, with an organic medium composed of a co-polymer of vinylidene chloride and acrylonitrile resin (also known as Saran F-310 resin, Dow Chemical, Midland, Mich.). The molecular weight of the resin was approximately 25,000. The surface area/weight ratio of the silver particles is in the range of 0.8-1.3 m²/g.

A solvent was used to dissolve the resin completely prior to adding the silver flake. That solvent was a 50/50 blend of DiBasic Esters (DuPont, Wilmington, Del.) and C-11 Ketone solvent (Eastman Chemical Company, Kingsport, Tenn.). A small amount of additional C-11 Ketone was added to the formulation.

The polymer thick film composition was:

| | |
|---|---|
| 64.00% | Flaked Silver with Stearic Acid surfactant |
| 35.50 | Organic Medium (19.5% resin/80.5% solvent) |
| 0.50 | C-11 Solvent |

This composition was mixed for 30 minutes on a planetary mixer. The composition was then transferred to a three-roll mill where it was subjected to a first pass at 150 PSI and a second pass at 250 PSI. At this point, the composition was used to screen print a silver pattern on polyester. Using a 280 mesh stainless steel screen, a series of lines were printed, and the silver paste was dried at 140° C. for 15 min. in a forced air box oven. The resistivity was then measured as 4.6 milliohm/sq/mil at a thickness of 10 microns. As a comparison, a standard composition such as DuPont product 5025 was measured as 13.6 milliohm/sq/mil. Another high conductivity standard product such as DuPont 5028 showed 9.8 milliohm/sq/mil, which is 2× higher resistivity than the example given above. This unexpectedly large improvement (lowering) in resistivity, a key property for all silver compositions, enables it to be used for most applications and improves RFID antenna performance. Also note that the value observed, 4.6 mohm/sq/mil, is approaching that of high temperature fired (850° C.) silver conductors. A comparison table appears below:

| Silver Composition | Adhesion to Polyester | Resistivity mohm/sq/mil |
|---|---|---|
| 5025 | Good | 13.6 |
| 5028 | Good | 9.8 |
| Example 1 | Excellent | 4.6 |
| High Temp. (850° C.) Ag | Not applicable | 1.5 |

EXAMPLE 2

Another PTF silver composition was prepared, except that the surfactant on the silver flake was changed from stearic acid to oleic acid. All other properties of the formulation, silver powder distribution, and the subsequent processing were the same as Example 1. That is, the same organic medium was used as in Example 1. The normalized resistivity for this composition was 42.8 mohm/sq/mil. It is apparent that a change in surfactant chemistry on the silver flake has a significant (negative) impact on the resistivity of the composition.

EXAMPLE 3

Another PTF silver composition was prepared except that the particle size distribution was shifted to smaller particles. Here, the average particle size was reduced to approximately 2 microns and there were virtually no particles greater than 7 microns. The surfactant of Example 2, oleic acid, was used on the silver flake. All other processing conditions were the same as example 1. The normalized resistivity for this composition was 20.2 mohm/sq/mil again showing the criticality of the particle size of the silver chosen and the surfactant used.

EXAMPLE 4

Another PTF silver composition was prepared as per Example 1 except the resin used was changed from the vinyl co-polymer described in Example 1 to a thermoplastic polyester resin of molecular weight 25000. All other conditions and processing were the same. The normalized resistivity measured was 22.7 mohm/sq/mil establishing the criticality of the resin used in Example 1 in concert with the silver powder.

What is claimed is:

1. A polymer thick film composition comprising:
   (a) 50%-85% by weight silver flake with an average particle size of at least 3 microns, at least 10% of the particles greater than 7 microns, and a stearic acid surfactant; and
   (b) 15-50% by weight organic medium comprising:
      (1) 16-25% by weight vinyl copolymer resin, wherein said vinyl copolymer resin is a copolymer of vinylidene chloride with at least one of vinyl chloride, acrylonitrile, and alkyl acrylate; and
      (2) 75-84% by weight organic solvent.

2. A process of forming a RFID antenna, the process comprising:
   a) applying the composition of claim 1 onto a substrate;
   b) drying the composition to form a circuit; and
   c) applying a voltage across the circuit.

3. The composition of claim 1, wherein said vinyl copolymer resin is a copolymer of vinylidene chloride and acrylonitrile.

4. The composition of claim 1 wherein the silver flake particle size ranges from 1-100 microns.

5. The composition of claim 4 wherein the silver flake particle size ranges from 2-18 microns.

6. The composition of claim 1 wherein the organic solvent is selected from the group consisting of ethyl acetate, terpenes such as alpha- or beta-terpineol, kerosene, dibutylphthalate, butyl carbitol, butyl carbitol acetate, hexylene glycol, alcohols, alcohol esters, glycol ethers, ketones, esters and mixtures thereof.

7. The composition of claim 6 wherein the solvent is selected from esters, ketones and mixtures thereof.

8. The composition of claim 6 wherein the boiling point of the organic solvent is 180° C.-250° C.

9. The composition of claim 1 further comprising up to 1% by weight of gold, silver, copper, nickel, aluminum, platinum, palladium, molybdenum, tungsten, tantalum, tin, indium, lanthanum, gadolinium, boron, ruthenium, cobalt, titanium, yttrium, europium, gallium, sulfur, zinc, silicon, magnesium, barium, cerium, strontium, lead, antimony, conductive carbon, and combinations thereof.

10. A process of preparing a silver conductor, the process comprising:
   A. applying to a substrate a polymer thick film comprising:
      (a) 50-85% by weight silver flake with an average particle size of at least 3 microns, at least 10% of the particles greater than 7 microns, and stearic acid surfactant; and
      (b) 15-50% by weight organic medium comprising:
         (1) 16-25% by weight vinyl copolymer resin, wherein said vinyl copolymer resin is a copolymer of vinylidene chloride with at least one of vinyl chloride, acrylonitrile, and alkyl acrylate; and
         (2) 75-84% by weight organic solvent; and
   B. evaporating the organic solvent.

11. A silver conductor prepared by the process of claim 10.

12. A RFID circuit formed using the silver conductor of claim 11.

* * * * *